United States Patent [19]

Strack

[11] Patent Number: 5,302,537
[45] Date of Patent: * Apr. 12, 1994

[54] MANUFACTURING METHOD FOR A LOW VOLTAGE POWER MISFET UTILIZING ONLY THREE MASKS

[75] Inventor: Helmut Strack, Munich, Fed. Rep. of Germany

[73] Assignee: Siemens Aktiengesellschaft, Munich

[*] Notice: The portion of the term of this patent subsequent to Feb. 11, 2009 has been disclaimed.

[21] Appl. No.: 976,189

[22] Filed: Nov. 13, 1992

[30] Foreign Application Priority Data

Nov. 13, 1991 [DE] Fed. Rep. of Germany ....... 4137341

[51] Int. Cl.$^5$ .......................................... H01L 21/265
[52] U.S. Cl. .................................... 437/40; 437/41; 437/203; 437/228; 148/DIG. 126
[58] Field of Search .......................................... 437/4–8, 437/27, 29, 40, 43–44, 912, DIG. 126, 41; 257/124–125, 133–145, 334–338

[56] References Cited

U.S. PATENT DOCUMENTS

| | | | |
|---|---|---|---|
| 4,055,884 | 11/1977 | Jambotkar | 437/44 |
| 5,087,577 | 2/1992 | Strack | 437/29 |
| 5,179,032 | 1/1993 | Quigg | 437/41 |

FOREIGN PATENT DOCUMENTS

0313249A1 4/1989 European Pat. Off.
0460251A1 12/1991 European Pat. Off.
4013435A1 12/1990 Fed. Rep. of Germany.

Primary Examiner—Olik Chaudhuri
Assistant Examiner—H. Jey Tsai
Attorney, Agent, or Firm—Hill, Steadman & Simpson

[57] ABSTRACT

A manufacturing method for a low-voltage power MISFET which utilizes only three masks (photosteps). In the first step, a polysilicon layer (3) is structured and a cell field and edge zones are produced. An oxide layer (2) is then applied, this being opened in the second photostep above the cells and the edge zones and between the edge (4) and the cells. A metal layer is then applied, this being interrupted between the cells and the edge (4) with the third photostep. Field plates and a channel stopper (9) are thus produced. As last step, a weakly conductive layer (20) is applied onto the entire surface.

7 Claims, 2 Drawing Sheets

MANUFACTURING METHOD FOR A LOW VOLTAGE POWER MISFET UTILIZING ONLY THREE MASKS

BACKGROUND OF THE INVENTION

The present invention is directed to a method for manufacturing a power MISFET having a semiconductor substrate that has a field of transistor cells as well as at least one field plate and at least one channel stopper.

Methods for manufacturing such MISFETs are standard practice. At least four, but usually five or more photosteps are thus required in order to produce the fine structures of such a power MISFET. A mask is required for every photostep. A significant reduction of the manufacturing costs can only be achieved by reducing the number of photosteps.

SUMMARY OF THE INVENTION

It is an object of the present invention to provide a method that is employable for a low-voltage power MISFET that utilizes only three photosteps.

This method has the following steps:
a) the semiconductor substrate is covered with a first oxide layer;
b) the first oxide layer is covered with a polysilicon layer;
c) the polysilicon layer is structured with a first photostep;
d) the transistor cells and edge zones lying above one another are produced;
e) the semiconductor substrate is covered with a second oxide layer;
f) with a second photostep, through holes or a contact region are respectively produced in the second oxide layer in the region of the transistor cells and the edge zones, and an annular depression which surrounds the transistor cells is produced in the polysilicon layer between the transistor cells and the edge zones;
g) the semiconductor substrate is covered with a metal layer;
h) the metal layer and the polysilicon layer are completely interrupted in the region of the annular depression by a third photostep; and
i) subsequently, a weakly conductive layer is applied onto the surface.

BRIEF DESCRIPTION OF THE DRAWINGS

The features of the present invention which are believed to be novel, are set forth with particularity in the appended claims. The invention, together with further objects and advantages, may best be understood by reference to the following description taken in conjunction with the accompanying drawings, in the several Figures in which like reference numerals identify like elements, and in which:

DESCRIPTION OF THE PREFERRED EMBODIMENT

Figure 1:
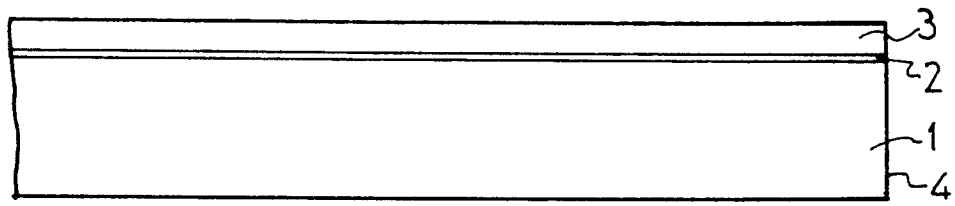
FIGS. 1–6 are fragmentary side views showing various steps in a method for manufacturing a power MISFET according to the method of the present invention.

FIG. 1 shows a semiconductor substrate 1 that is, for example, weakly n-conductive. The semiconductor substrate 1 is covered with an oxide layer 2 that is employed as gate oxide. Subsequently, the layer 2 is covered with a polysilicon layer 3.

Figure 2:
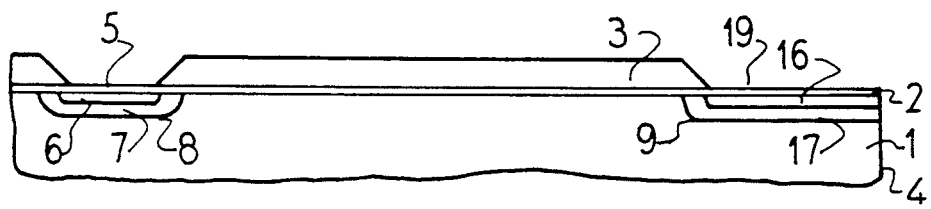

The polysilicon layer 3 is structured in a first photostep, whereby openings 5 for the transistor cells and an opening 19 lying at the edge for the channel stopper arise (FIG. 2). These openings have slanting sidewalls, so that the polysilicon layer 3 can serve as a mask for producing the source zones 6 and the base zones 7 or the zones 16, 17 lying above one another in the channel stopper 9 lying at the edge 4. Source zones 6, base zones 7 and the zones 16, 17 are produced in a known way, for example by implantation of arsenic or phosphorus ions, or boron ions. The energy of the boron ions is higher, so that these also penetrate the slanting part of the polysilicon layer 3 employed as a mask and penetrate more deeply into the semiconductor substrate 1. Transistor cells 8 and the zones 16, 17 are produced in this step.

Figure 3:
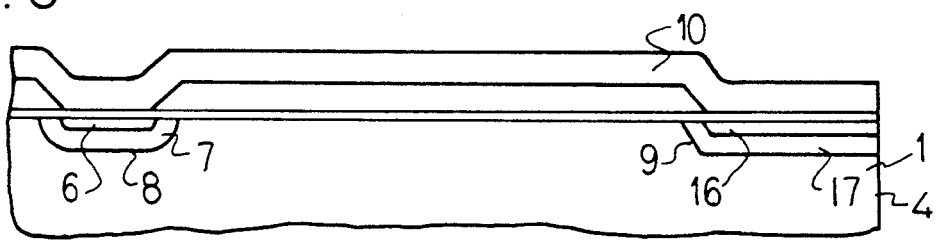
Figure 4:
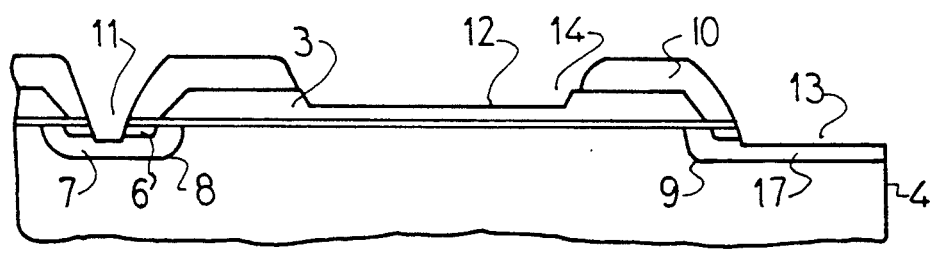

As next step (FIG. 3), a second oxide layer 10 is applied which is several times thicker than the oxide layer 2. The oxide layer 10 covers the entire surface of the semiconductor substrate 1. In a second photostep, the second oxide layer 10 is structured. It is opened in the region of the transistor cells and the zones 16, 17 such that through holes 11 or a contact region 13, respectively, arise, these extending to the base zones 7 and to the edge zones 17, respectively. In the same photostep, an opening 14 that annularly surrounds the transistor cells 8 is produced in the second oxide layer 10 between the transistor cells 8 and the edge zones. The same etching process that opens the through holes 11 and the contact region 13 to the surface of the base zone 7 and the edge zone 17, respectively, also etches an annular depression 12 into the polysilicon layer 3.

Subsequently, a metal layer 18 of, for example, aluminum is applied onto the surface of the semiconductor substrate. This layer forms the source contacts for the transistor cells 8 and creates the shunts between the source zones 6 and base zones 7 for a power MISFET. The metal layer 18 contacts the edge zones 16, 17 in the region of the channel stopper 9.

Figure 5:
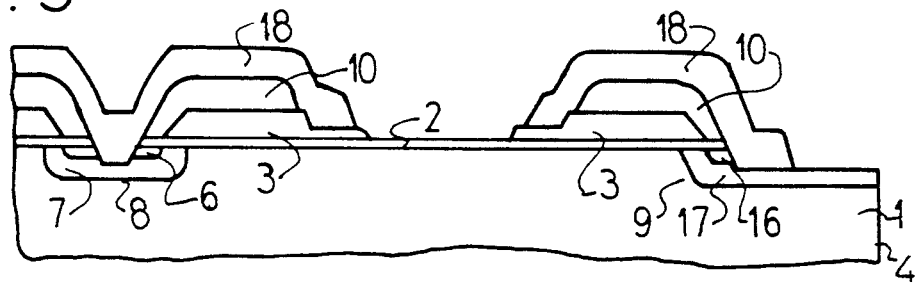
Figure 6:
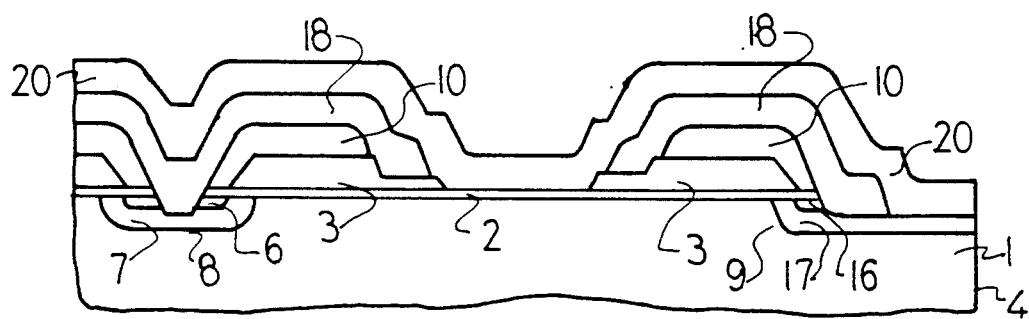

In a third and last photostep, the polysilicon layer 3 and the metal layer 18 are completely interrupted between cells 8 and the channel stopper 9 (FIG. 5). Subsequently, the entire surface is covered with a weakly conductive passivation layer 20 of, for example, amorphous silicon or silicon nitride (FIG. 6). The conductivity of the latter can be set by the ratio of silicon to nitrogen.

The metal layer 18 connected to the transistor cells 8 acts as field plate together with that part of the polysilicon layer 3 connected to it. The metal layer 18 connected to the edge zones 16, 17 acts as channel stopper electrode in combination with the polysilicon layer connected to it. Since the pn-junction limiting the edge zones 17 is extremely poor due to its edge position and as a consequence of mechanical separating processes, for example sawing, a relatively good contact is established between the channel stopper and the substrate of the semiconductor substrate 1. For the same reason, the source 16 also does not act as source zone. Good long-term stability of the blocking characteristics is achieved as a result of the weakly conductive layer 20.

The invention is not limited to the particular details of the method depicted and other modifications and applications are contemplated. Certain other changes may be made in the above described method without departing from the true spirit and scope of the invention herein involved. It is intended, therefore, that the subject matter in the above depiction shall be interpreted as illustrative and not in a limiting sense.

What is claimed is:

1. A method for manufacturing a power MISFET having a semiconductor substrate that has a field of transistor cells as well as at least one field plate and at least one channel stopper, comprising the steps of:
    covering the semiconductor substrate with a first oxide layer;
    covering the first oxide layer with a polysilicon layer;
    structuring the polysilicon layer with a first photostep;
    producing the transistor cells and producing edge zones lying above one another for the channel stopper;
    covering the semiconductor substrate with a second oxide layer;
    with a second photostep, producing through holes in the second oxide layer in the region of the transistor cells and producing an opening for contact regions at the edge zones in the second oxide layer and producing an annular depression which surrounds the transistor cells in the polysilicon layer between the transistor cells and the edge zones;
    covering the semiconductor substrate with a metal layer;
    with a third photostep, completely interrupting the metal layer and the polysilicon layer in a region of the annular depression; and
    subsequently, applying passivation layer onto a resulting surface of the MISFET.

2. A method according to claim 1, wherein said passivation layer is amorphous silicon.

3. A method according to claim 1, wherein said passivation layer is silicon nitride.

4. A method for manufacturing a power MISFET having a semiconductor substrate that has a field of transistor cells as well as at least one field plate and at least one channel stopper, comprising the steps of:
    covering the semiconductor substrate with a first oxide layer;
    covering the first oxide layer with a polysilicon layer;
    structuring the polysilicon layer with a first photostep;
    producing the transistor cells and producing edge zones lying above one another for the channel stopper;
    covering the semiconductor substrate with a second oxide layer;
    structuring the second oxide layer such that at least an annular depression surrounding the transistor cells is produced in the polysilicon layer between the transistor cells and the edge zones;
    covering the semiconductor substrate with a metal layer;
    with a third photostep, completely interrupting the metal layer and the polysilicon layer in a region of the annular depression thereby forming a surface of the MISFET; and
    applying a passivation layer onto a resulting surface of the MISFET.

5. A method according to claim 4, wherein said passivation layer is amorphous silicon.

6. A method according to claim 4, wherein said passivation layer is silicon nitride.

7. A method for manufacturing a power MISFET having a semiconductor substrate that has a field of transistor cells as well as at least one field plate and at least one channel stopper, comprising the steps of:
    covering the semiconductor substrate with a first oxide layer;
    covering the first oxide layer with a polysilicon layer;
    structuring the polysilicon layer with a first photostep;
    producing the transistor cells and producing edge zones lying above one another for the channel stopper;
    covering the semiconductor substrate with a second oxide layer;
    structuring the second oxide layer such that an annular depression surrounding the transistor cells is produced in the polysilicon layer between the transistor cells and the edge zones;
    covering the semiconductor substrate with a metal layer;
    with a third photostep, completely interrupting the metal layer and the polysilicon layer in a region of the annular depression; and
    applying one of amorphous silicon and silicon nitride onto a resulting surface of the MISFET as a passivation layer that provides substantial stability of blocking characteristics of the MISFET.

* * * * *